United States Patent
Ngo et al.

(10) Patent No.: US 9,880,213 B2
(45) Date of Patent: Jan. 30, 2018

(54) CONDUCTOR MONITOR DEVICE AND METHOD

(71) Applicant: OES, Inc., London (CA)

(72) Inventors: Kiet Ngo, London (CA); Michael Reeve, London (CA)

(73) Assignee: OES, INC., London, Ontario (CA)

( * ) Notice: Subject to any disclaimer, the term of this patent is extended or adjusted under 35 U.S.C. 154(b) by 415 days.

(21) Appl. No.: 13/969,758

(22) Filed: Aug. 19, 2013

(65) Prior Publication Data

US 2015/0048842 A1    Feb. 19, 2015

(51) Int. Cl.
*G01R 31/08*    (2006.01)
*G01R 31/02*    (2006.01)
(Continued)

(52) U.S. Cl.
CPC ........... *G01R 31/022* (2013.01); *G01R 29/08* (2013.01); *H01R 43/28* (2013.01); *H02G 1/1248* (2013.01);
(Continued)

(58) Field of Classification Search
CPC ........ H01R 43/28; H01R 43/05; H01R 43/01; H02G 1/1256; H02G 1/1248;
(Continued)

(56) References Cited

U.S. PATENT DOCUMENTS 3,798,541 A * 3/1974 Campbell et al. ........... 324/72.5
4,325,022 A * 4/1982 Pelletier ................. G01R 31/11
324/127

(Continued)

FOREIGN PATENT DOCUMENTS

JP    02133016 A  *  5/1990  .............. H02G 1/12
JP    06253430        9/1994
(Continued)

OTHER PUBLICATIONS

International Search Report and Written Opinion of the International Searching Authority for International application No. PCT/CA2014/050770 dated Oct. 28, 2014.
International Search Report and Written Opinion of the International Searching Authority for International application No. PCT/CA2016/050014 dated Mar. 14, 2016.

*Primary Examiner* — Huy Q Phan
*Assistant Examiner* — Adam Clarke
(74) *Attorney, Agent, or Firm* — Carlson, Gaskey & Olds

(57) ABSTRACT

An illustrative example conductor monitoring device includes a generator configured to radiate a field into a conductor. A detector is configured to detect at least some of the field propagated along the conductor. A processor is configured to determine when a change in the propagated field detected by the detector indicates contact between the conductor and a conductive blade of a wire processing machine. The example conductor monitoring device is capable of providing information regarding the condition of a conductor that has gone through a wire handling process that involves cutting the wire and stripping insulation from near the end of the cut wire, for example. The information regarding the condition of the wire is obtained without making contact with the wire and without interfering with or requiring any alteration of the wire handling process or machine.

17 Claims, 5 Drawing Sheets

(51) Int. Cl.
*G01R 29/08* (2006.01)
*H01R 43/28* (2006.01)
*H02G 1/12* (2006.01)

(52) U.S. Cl.
CPC ......... *H02G 1/1256* (2013.01); *H02G 1/1258* (2013.01)

(58) Field of Classification Search
CPC ........ H02G 1/1253; H02G 1/005; H02G 1/12; G01R 31/021; G01R 31/022; G01B 7/12
USPC .............. 324/539–544, 501, 527–533; 30/90.1–91.2; 81/9.4–9.51; 83/522.12, 83/522.15
See application file for complete search history.

(56) References Cited

U.S. PATENT DOCUMENTS

| | | | |
|---|---|---|---|
| 4,348,639 A * | 9/1982 | Karbowski | 324/329 |
| 5,146,673 A * | 9/1992 | Hoffa | 29/825 |
| 5,831,426 A | 11/1998 | Black, Jr. et al. | |
| 6,501,285 B1 | 12/2002 | Hopkins et al. | |
| 6,621,276 B2 | 9/2003 | Wen et al. | |
| 7,091,872 B1 * | 8/2006 | Bigelow et al. | 340/664 |
| 7,587,918 B2 | 9/2009 | Imgrut | |
| 7,622,931 B2 * | 11/2009 | Wu et al. | 324/534 |
| 7,969,137 B2 * | 6/2011 | Royle | 324/67 |
| 2007/0121796 A1 * | 5/2007 | Lurati et al. | 379/24 |
| 2010/0077899 A1 | 4/2010 | Yano et al. | |
| 2011/0101976 A1 | 5/2011 | Artinger | |
| 2011/0246095 A1 | 10/2011 | Lim | |
| 2012/0133373 A1 * | 5/2012 | Ali | G01R 31/021 324/543 |
| 2012/0314226 A1 | 12/2012 | Kelly | |
| 2013/0125710 A1 | 5/2013 | Hombu | |
| 2014/0033874 A1 | 2/2014 | Nakamura et al. | |
| 2014/0033875 A1 | 2/2014 | Nakamura | |
| 2015/0048842 A1 | 2/2015 | Ngo et al. | |

FOREIGN PATENT DOCUMENTS

| | | | |
|---|---|---|---|
| JP | 7-87643 | 3/1995 | |
| JP | 07227022 A * | 8/1995 | H02G 1/12 |
| JP | 2013019710 A * | 1/2013 | |

* cited by examiner

CONDUCTOR MONITOR DEVICE AND METHOD

BACKGROUND

Electrical conductors are used in a variety of situations, such as in vehicle systems, for providing power to electrically powered components and communicating information among components. Most automated assembly techniques that involve electrical conductors include cutting the wires to a desired length and stripping insulation from the ends of the wire. The exposed wire ends are eventually connected in a manner that facilitates the desired power or communication connections.

One of the difficulties associated with wire processing equipment is that it may not be possible to avoid improperly cut or otherwise damaged wires. For example, the insulation stripping blades may penetrate too deeply through the insulation and contact the wire. It is also possible that the wire is not centered within the insulation at the location where the stripping blades contact the insulation and the blades also contact the wire. It is also possible, for example, that the segment of wire that is introduced to the stripping device has a configuration that results in an unexpected alignment between the stripping blades and the wire so that the stripping blades contact the wire when the insulation is cut and stripped from the wire end. Contact between an insulation stripping blade and a wire during the stripping operation typically results in an undesirably cut or damaged wire. If the integrity of a wire end is compromised the eventual connection that is supposed to be made through that wire may be faulty.

Detecting damage to the wires during the stripping process has proven difficult for several reasons. For example machine throughput may be at a very high rate which requires a very fast response from a detection device and reliable detection may not be achievable without slowing down the wire processing machine. Additionally, the way in which wires are manipulated during the cutting and stripping process makes it difficult or impractical to attempt to establish an electrically conductive physical connection with the wire for monitoring purposes.

One attempt at detecting when a wire may have been damaged while insulation was stripped from the wire is described in the United States Published Patent Application No. US2013/0125710. That document suggests using a wired connection between the stripping blades and a control board and measuring an impedance of the stripping blades. If there is contact between the stripping blades and the conductive wire, the impedance of the conductive wire is effectively added to that of the stripping blades. The increased impedance is described as being detectable for purposes of identifying when the stripping blades contact the wire. One drawback associated with that approach is that it requires a specially designed stripping device or modification of a stripping device to include the electrically conductive connection between the stripping blades and the control board.

With the increasing amount of technology being included in vehicles, for example, there is an increasing need for wiring and more reliable connections. Current trends also include a desire to reduce the size (i.e., diameter) of the wires. It is becoming increasingly important to ensure that damaged or improperly cut wires are identified to avoid faulty or unreliable connections.

SUMMARY

An illustrative example conductor monitoring device includes a generator configured to radiate a field toward a conductor. A detector is configured to detect at least some of the field propagated along the conductor. A processor is configured to determine when a change in the propagated field detected by the detector indicates contact between the conductor and a conductive blade of a wire processing machine.

Another illustrative example conductor monitoring device includes a first electrode that induces a signal in a conductor without any electrically conductive, physical connection between the first electrode and the conductor. A second electrode detects at least some of the induced signal from the conductor without any electrically conductive, physical connection between the second electrode and the conductor. A processor provides an indication of a defect in the conductor based on information from the second electrode.

An illustrative example method of monitoring a conductor includes radiating a field into the conductor. At least some of the field propagated along the conductor is detected. A determination is made when a change in the detected field from the conductor indicates contact between the conductor and a conductive blade of the wire processing machine.

Another illustrative example method includes inducing a signal in a conductor without making electrically conductive, physical contact with the conductor. At least some of the induced signal is detected without making electrically conductive, physical contact with the conductor. The method includes providing an indication of a defect in the conductor based on information regarding the detected signal. In at least some examples, the indication may indicate that an electrically conductive wire handling machine component contacts the conductor.

The example conductor monitoring devices and method may be capable of providing information regarding the condition of a conductor during a wire handling process that involves cutting the wire and stripping insulation from near the end of the cut wire, for example. The information regarding the condition of the wire can be obtained without making contact with the wire and without interfering with or requiring any alteration of the wire handling process or machine.

The various features and advantages of disclosed examples will become apparent to those skilled in the art from the following detailed description. The drawings that accompany the description can be briefly described as follows.

DETAILED DESCRIPTION

Figure 1:
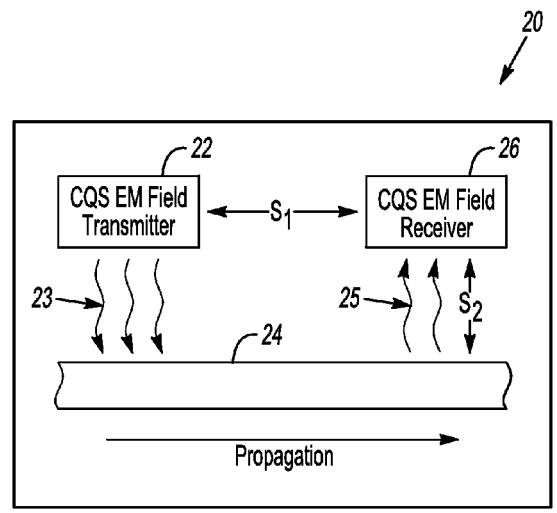
FIG. 1 schematically illustrates a conductor monitoring device designed according to an embodiment of this invention.

An example conductor monitoring device 20 is schematically shown in FIG. 1. A generator or transmitter 22 is configured to radiate a field schematically shown at 23 toward a conductor 24. The generator or transmitter 22 comprises at least one electrode in this example.

A detector or receiver 26 is configured to detect at least a portion of a field schematically shown at 25 that results from a signal induced in the conductor 24 that is propagated along the conductor 24. The induced signal in the conductor 24 results from the radiated field 23. In at least one sense, the conductor 24 acts like an antenna that radiates the field schematically shown at 25 in a manner that it can be detected by the detector 26.

The detector or receiver 26 comprises at least one electrode that is situated relative to the conductor 24 and the generator 22 so that the detector 26 will detect the field schematically shown at 25 instead of directly detecting the field 23 that is radiated from the generator 22. In FIG. 1, a spatial arrangement as schematically represented by the larger distance or spacing $S_1$ between the generator 22 and the detector 26 compared to a smaller distance or spacing $S_2$ between the detector 26 and the conductor 24 facilitates the detector 26 receiving or detecting the field 25 instead of the field 23. Given this description, those skilled in the art will realize how to arrange the generator 22 and detector 26 in a manner that facilitates the detector 26 detecting at least some of the field 25 that radiates from the conductor 24.

In at least one example, the field 23 comprises an electromagnetic field. Radiating the field 23 toward the conductor 24 indirectly or remotely injects electrical or electromagnetic energy into the conductor 24. The electromagnetic field 23 effectively induces current or a signal that is propagated along the conductor 24. In the illustrated examples, no electrically conductive, physical connection between the generator 22 and the conductor 24 is required. Detection is also indirect or remote because no electrically conductive, physical connection between the detector 26 and the conductor 24 is required.

Using indirect or remote signal injection allows for monitoring the quality of a conductor during a wire handling or processing operation without requiring any physical, electrically conductive connection for introducing an electrical signal onto the conductor 24. Additionally, using indirect or remote generation and detection allows for the monitoring device 20 to be more readily incorporated into a variety of wire processing machines. The generator 22 and detector 26 do not require any modification to an existing wire processing machine. The generator 22 and detector 26 can be incorporated into a machine design or be configured as separate or distinct device that can be used in conjunction with a wire processing machine.

In at least one example, the generator 22 uses very low frequency range radiation, such as an electromagnetic field having a frequency that is less than 100 kHz. In some examples, a frequency range between about 40 kHz and about 70 kHz is used. One feature of that frequency range is that its corresponding wavelength is within a range of a length of a spool of wire used with wire processing machinery (e.g., thousands of meters). When there is correspondence between the wavelength and the wire length, the spool of wire may serve as a form of a half wave dipole antenna or a quarter wave monopole antenna, which may boost the signal of the detector 26.

Such a frequency range (i.e., 40-70 kHz) allows for incorporating conductor quality monitoring without introducing any concern for adversely affecting a machine operator. Additionally, such low frequency radiation is much less likely to cause any interference with the operation of the wire processing machine or other devices in the vicinity of that machine. Additionally, using a frequency range on the order of about 40 kHz to about 70 kHz is below the AM radio wave spectrum so that there is no concern with regulation compliance, such as that required by the United States Federal Communication Commission for higher frequencies.

Figure 2:
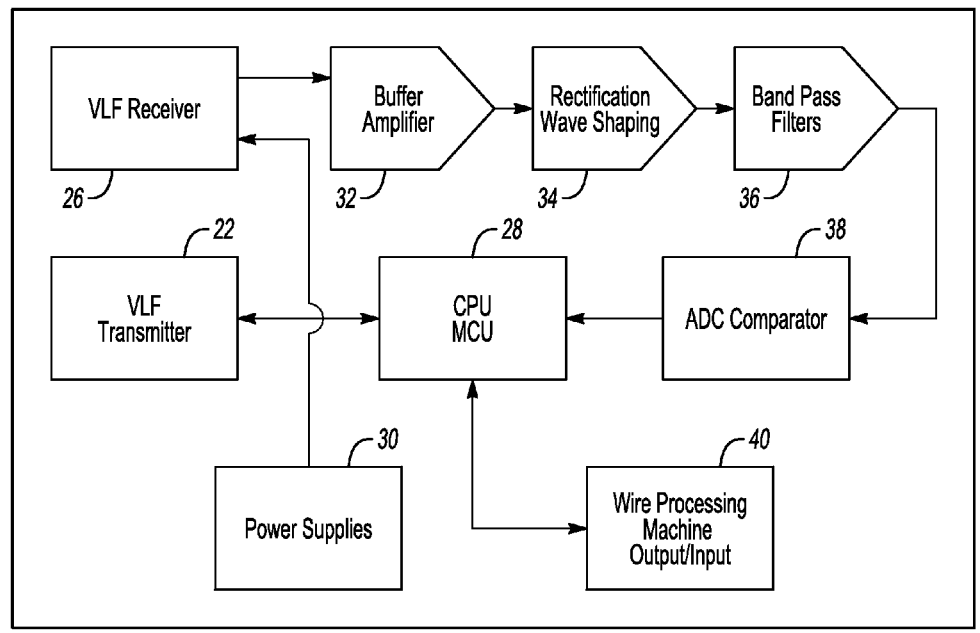
FIG. 2 schematically illustrates additional features of an example embodiment of a conductor monitoring device.

FIG. 2 schematically illustrates additional selected details of an example conductor monitoring device 20. In this example, a processor 28 communicates with the generator 22 and the detector 26. The processor 28 is configured to determine when a change in the propagated field 25 detected by the detector 26 indicates contact between the conductor 24 and a conductive blade of a wire processing machine.

In the example of FIG. 2, a power supply 30 provides power to the generator 22, detector 26 and processor 28. As the detector 26 detects a signal or field radiated from the conductor 24, it generates an output that is provided to a buffer amplifier 32 to increase the power or amplitude of a detected signal. A rectifier 34 facilitates shaping the waveform of the detected signal amplified by the amplifier 32. At least one band pass filter 36 filters out noise, for example, from the signal before it is provided to a comparator 38. In this example, the processor 28 receives information from the comparator 38 that indicates a state of the signal or field detected by the detector 26.

The example of FIG. 2 includes an output 40, such as a visual display, to communicate information regarding the quality of a conductor that has been cut, for example, and otherwise handled according to a desired wire handling operation. The controller 28 controls the display or output 40 in one of a variety of manners, one of which is described below. In some examples, the output 40 comprises an interface for communications between the processor 28 and a wire handling machine. This allows for the processor 28, for example, to obtain information regarding a particular stage of the wire processing operation so that the controller 28 can associate information regarding that which is detected by the detector 26 and a portion of a wire processing operation to provide a meaningful output.

Figure 3:
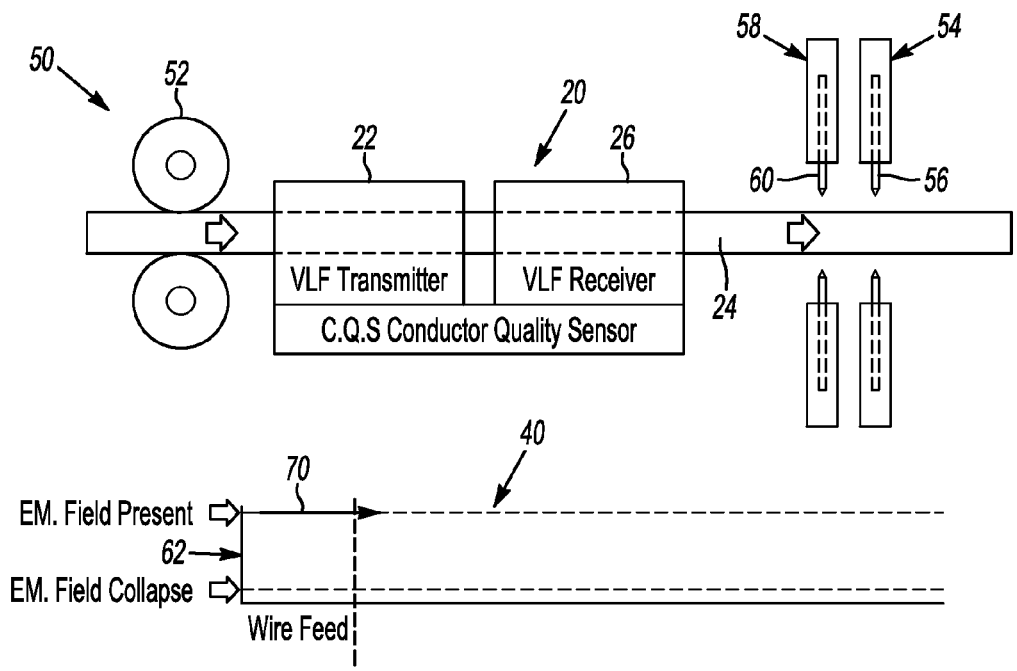
FIG. 3 schematically illustrates selected portions of a wire processing machine and a conductor monitoring device designed according to an embodiment of this invention during one stage of a wire processing operation.

FIG. 3 schematically illustrates selected portions of a wire processing machine 50 including a wire feed device 52 that feeds the conductor 24 along appropriate portions of the machine 50 to carry out a desired wire processing operation.

A wire processing operation that involves cutting the conductor 24 to a desired length and stripping insulation from at least one cut end of the wire is considered for discussion purposes.

As shown in FIG. 3, the machine 50 includes a cutting device 54 that includes at least one electrically conductive cutting blade 56. A stripping portion 58 includes at least one electrically conductive stripping blade 60 that is configured to strip insulation from the exterior of the conductor 24. The output 40 in FIG. 3 includes a DC wave form plot 62. A DC wave form includes a first, positive value shown at 70 during the portion of the wire processing operation schematically shown in FIG. 3. As the conductor 24 is being fed along the machine toward the cutting portion 54, the generator 22 is inducing an electrical signal that is propagated along the conductor 24 and detected by the detector 26. The resulting output shown at 70 represents the determination made by the processor 28 regarding a value or characteristic of that which is detected by the detector 26, such as a positive field 25 radiated from the conductor 24.

Figure 4:
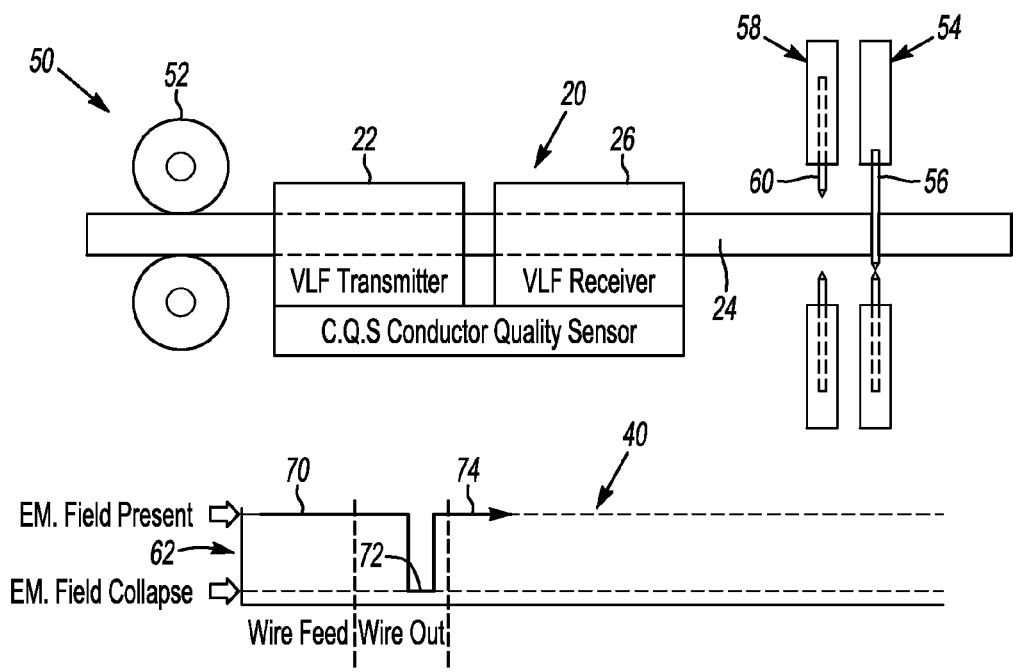
FIG. 4 illustrates the arrangement of FIG. 3 during another stage of the wire processing operation.

FIG. 4 schematically shows another stage of the wire processing operation. In FIG. 4, the cutting blade 56 moves into contact with and cuts through the conductor 24. The cutting blade 56 is electrically conductive. Contact between the cutting blade 56 and the conductive wires of the conductor 24 effectively results in grounding the signal that is propagated along the conductor 24, which results from the field generated by the generator 22.

Contact between the cutting blade 56 and the conductive wires of the conductor 24 is represented in the output 40 when the DC signal value drops as is shown at 72. After the cutting blade 56 is retracted and no longer in contact with the conductive wires of the conductor 24, the DC signal returns to a positive value shown at 74.

In embodiments where the processor 28 is provided with information regarding the stage of operation being accomplished by the machine 50, the processor 28 may provide an indication that the signal change at 72 corresponds to a desired cutting of the wire accomplished by the cutting blade 56.

Figure 5:
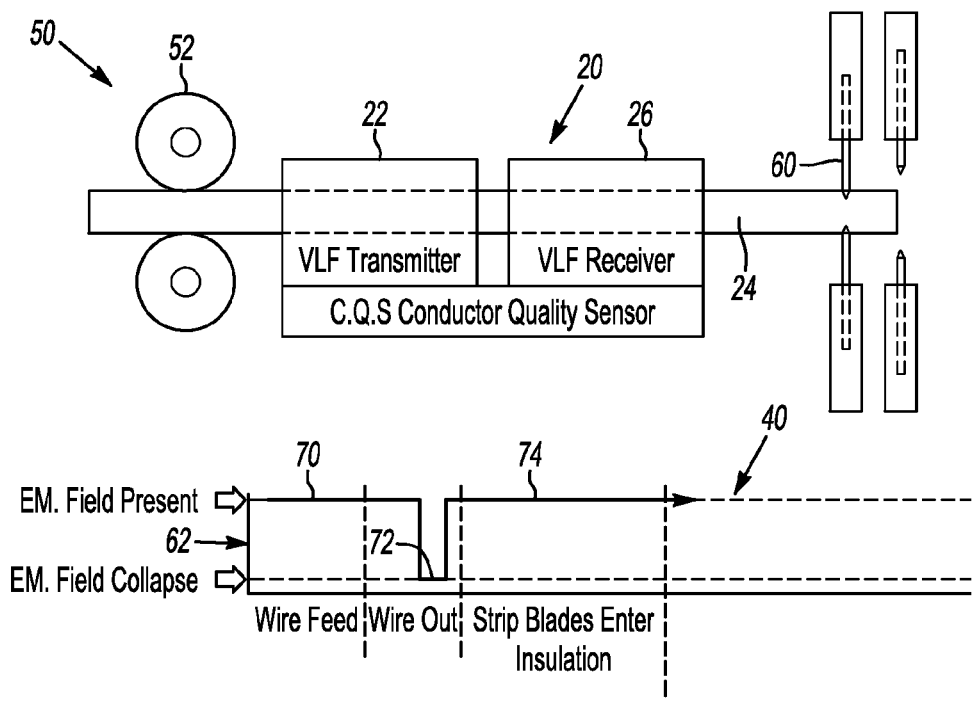
FIG. 5 illustrates the arrangement of FIGS. 3 and 4 during another stage of the wire processing operation.

FIG. 5 schematically illustrates a subsequent stage of the example wire processing operation. At this stage, the stripping blade 60 moves into contact with at least an exterior of the conductor 24. Provided that the stripping blade 60, which is electrically conductive, does not make contact with any of the conductive wires of the conductor 24, the signal value or amplitude remains essentially constant and positive as shown at 74 in the output 40 of FIG. 5.

Figure 6:
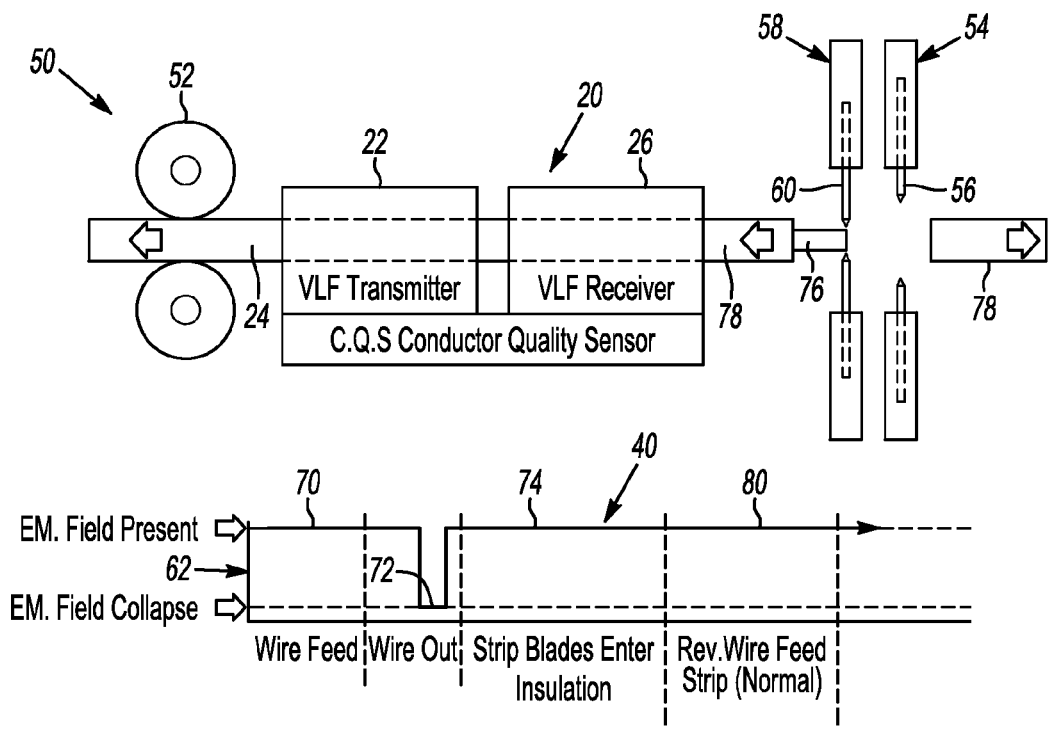
FIG. 6 illustrates the arrangement of FIGS. 3-5 during another stage of the wire processing operation.

FIG. 6 shows a later stage of the wire processing operation after the stripping blade 60 has cut through an insulation layer 78 and the conductor 24 has been retracted by the wire feed device 52 (e.g., drawn or pulled to the left according to the drawing) so that conductive wires 76 are exposed at one end of the conductor where the cut was made. The removed plug of insulation shown at 78' may be disposed of in a known manner.

The output 40 in FIG. 6 includes a positive value of the DC signal representation at 80. Given that the DC signal remained at the same value from 74 to 80, there was no electrically conductive contact between the stripping blade 60 and the conductive wires 76.

Figure 7:
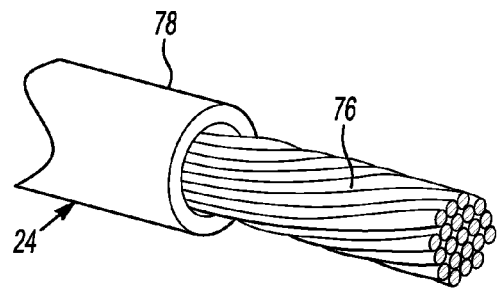
FIG. 7 diagrammatically illustrates a conductor that has been properly cut and had insulation stripped from the conductive wires, which would be an example result of the wire handling operation schematically shown in FIGS. 3-6.

FIG. 7 schematically illustrates an example conductor 24 that is considered acceptable because the wire cutting and stripping operation was successful. As shown in FIG. 7, a plurality of conductive wires 76 are exposed at the end of the conductor 24 and the insulation layer 78 covers another portion of the conductor. The exposed conductive wires 76 may then be used for establishing a desired type of connection, such as a crimp connection, for incorporating the conductor 24 into an assembly, such as a vehicle wire harness.

The output 40 in FIG. 6 represents a graphical illustration of a monitored wire cutting and insulation stripping operation that was accomplished in a manner that provides a desired condition of the resulting conductor. While a graphical illustration is shown as the example output 40, some embodiments of wire processing monitors designed according to this invention provide alternative forms of output such as written words or colors that provide an indication of a positive or negative result at various stages of the wire processing operation.

Figure 8:
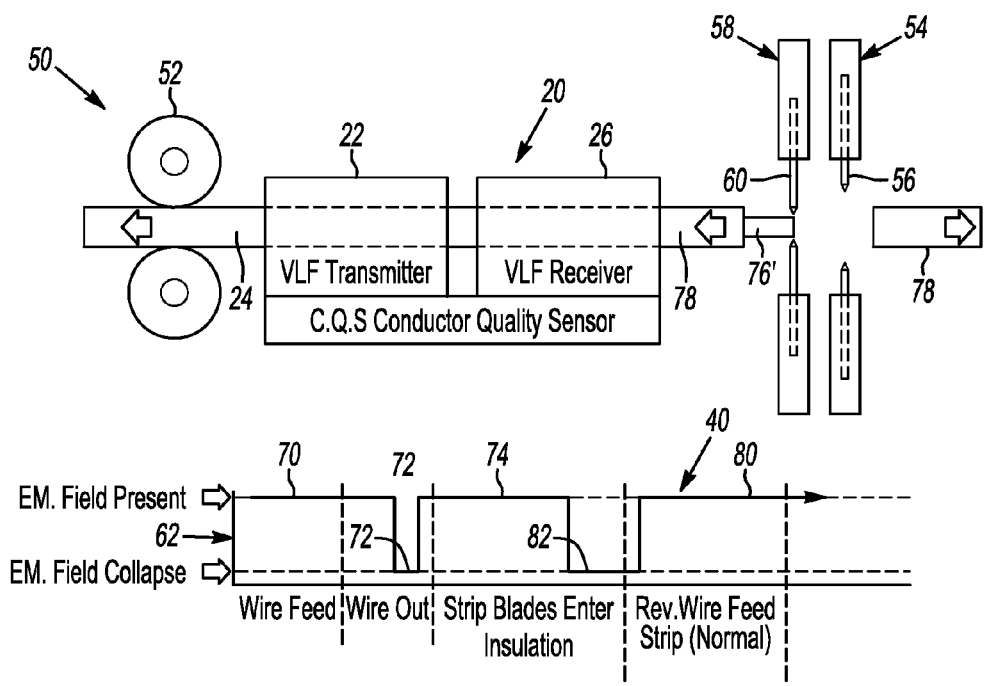
FIG. 8 schematically illustrates another condition during a stage of a wire handling operation in which conductive wires are contacted by a stripping blade during an insulation stripping portion of the operation.

FIG. 8 schematically illustrates a wire stripping stage of a wire processing operation in which the stripping blade 60 makes undesirable contact with at least one of the conductive wires 76 of the conductor 24. As shown in the output 40, the DC signal value drops at 82 before it returns to a positive value shown at 80. This grounding or reduction in the signal propagated along the conductor 24 is detected by the detector 26. The reduced signal value shown at 82 corresponds to the stripping blade 60 effectively grounding the signal or field propagated along the conductor 24 when there is contact between the electrically conductive stripping blade 60 and one or more of the conductive wires of the conductor 24. In FIG. 8, the resulting cut wire includes a damaged or improperly cut bundle of exposed wires 76' at one end of the cut conductor. The output 40 including the signal drop at 82 provides an indication that this wire should be rejected and not incorporated into a device or assembly that requires a properly cut and stripped wire.

Figure 9:
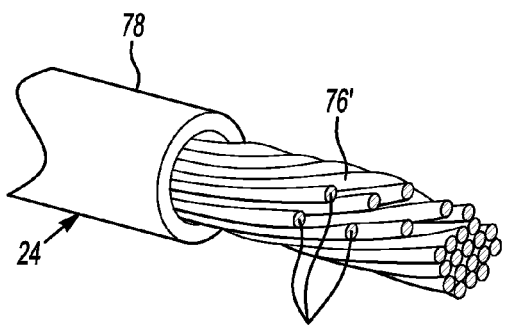
FIG. 9 schematically illustrates example damage to one or more conductive wires when there is undesired contact between a stripping blade and the conductive wires during an insulation stripping portion of a wire handling operation.
Figure 10:
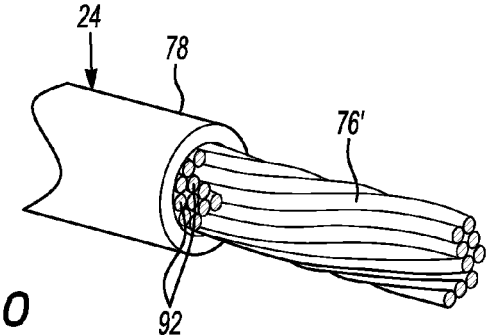
FIG. 10 diagrammatically illustrates an example improperly cut wire resulting from undesired contact between a stripping blade and the conductive wires during the insulation stripping portion of the wire handling operation.

The conductor quality monitor provides an ability to detect a variety of types of damage or alteration made to the conductor 24 during the wire processing operation. FIG. 9 schematically illustrates one example scenario in which a plurality of shorter or broken wire ends 90 are included among the exposed wires 76' resulting from contact between those individual wires and the stripping blade 60. FIG. 10 schematically illustrates an arrangement in which some of the wires 76' are cut short having ends at 92. The type of contact between the stripping blade 60 and the wires resulting in an arrangement as schematically shown in FIGS. 9 and 10 may be caused by a variety of circumstances. There may have been a malfunction in the operation of the stripping portion 58 of the machine 50, the conductor may have been presented to the stripping blade 60 in an unexpected position, or the conductive wires may not have been concentrically arranged uniformly within the insulation layer. These and other situations can be reliably detected using the conductor quality monitor device 20 of the illustrated example embodiment.

Figure 11:
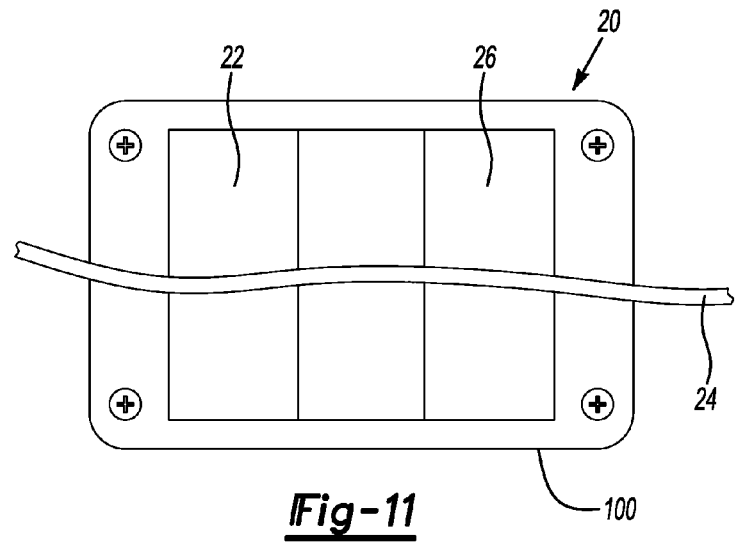
FIG. 11 diagrammatically illustrates selected features of an example embodiment of a conductor monitoring device designed according to this invention.

The configuration of the conductor quality monitor that includes a generator 22 and a detector 26 that allows for inducing and observing at least one electrical signal along a conductor without making contact with that conductor may take a variety of forms. FIG. 11 schematically illustrates an example embodiment in which a base or plate 100 supports an electrode that operates as the generator 22 and another electrode that operates as the detector 26. The electrodes may comprise flat plates or may have a U-shaped configuration, for example. A configuration such as that shown in FIG. 11 allows for the monitoring device 20 to be placed at a variety of positions relative to a wire processing machine.

Figure 12:
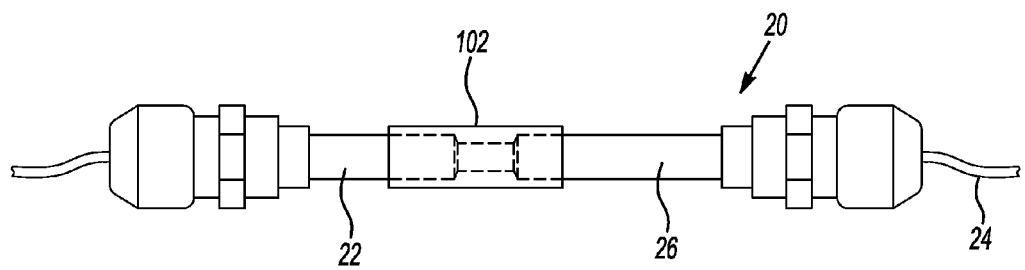
FIG. 12 diagrammatically illustrates another example embodiment of a conductor monitoring device.

FIG. 12 illustrates another example embodiment that includes a tubular configuration 102 through which the conductor 24 is passed during appropriate portions of the wire processing operation. In this example, a first cylindrical electrode serves as the generator 22 and the detector 26 comprises another cylindrical electrode. The conductor 24 is received within the tubes so that the signal or field detected by the detector 26 is induced in the conductor 24 by the generator 22 while the conductor 24 is within the tubes. There is no requirement for any electrically conductive, physical contact between any portion of the tubular configuration 102 and the conductor.

Figure 13:
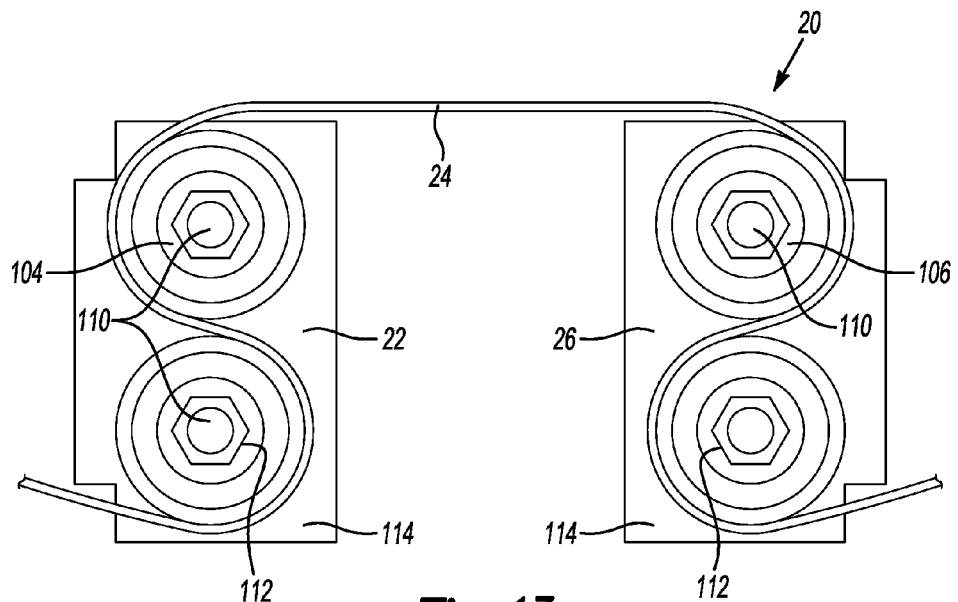
FIG. 13 diagrammatically illustrates another example embodiment of a conductor monitoring device.

FIG. 13 illustrates another example arrangement in which the conductor 24 is wound at least partially about a series of wheels or springs 104 and 106. The generator 22 in this example includes at least one electrode associated with the wheels 104 and the detector 106 includes at least one electrode associated with the wheels 106. Various portions of the illustrated example may be used as the electrodes for realizing the operation of the generator 22 and the detector 26, respectively. For example, metallic bearings (not illustrated), axels 110, fasteners 112 (e.g., nuts) or base plates 114 associated with the wheels or springs may operate as an electrode for purposes of realizing the function of the example generator 22 and detector 26, respectively.

Several different embodiments are illustrated and described above. The various features of those embodiments may be combined in ways not necessarily described or illustrated. In other words, the features of any one disclosed embodiment may be combined with one or more features of any of the other disclosed embodiments. Those skilled in the art who have the benefit of this description will realize what configuration of a generator, detector and processor consistent with the preceding description will best suit their particular needs.

The disclosed example conductor quality monitor devices allow for efficiently and reliably detecting when a wire is damaged or potentially damaged during a wire processing operation, such as one that involves cutting a wire and stripping insulation from it. The contactless monitoring device includes the feature of not requiring any physical, electrically conductive connection with the conductor, itself, but instead uses a remotely induced signal or field (i.e., without a direct, electrically conductive, physical connection) propagated along the conductor and remote detection of that signal or field. Additionally, the example devices described above can be utilized with a variety of wire processing machines without requiring any modification to those machines.

The preceding description is illustrative rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A conductor monitor device, comprising:
a first generally flat plate electrode that induces a signal in a conductor without any electrically conductive, physical connection between the first electrode and the conductor;
a second generally flat plate electrode that detects at least some of the induced signal from the conductor without any electrically conductive, physical connection between the second electrode and the conductor; and
a processor that provides an output indication that an electrically conductive wire handling machine component contacts the conductor, wherein the output indication has a first characteristic when there is a desired contact between the wire handling machine component and the conductor and the indication has a second, different characteristic when there is an undesired contact between the wire handling machine component and the conductor, wherein the undesired contact is subsequent to the desired contact and the second characteristic of the indication is subsequent to the first indication.

2. The device of claim 1, wherein the processor provides an indication of a defect in the conductor based on information from the second electrode.

3. The device of claim 2, wherein the processor provides the indication based on the information from the second electrode.

4. The device of claim 3, wherein the indication comprises an output that indicates when the detected induced signal decreases or is grounded.

5. The device of claim 1, wherein the first electrode radiates an electromagnetic field having a frequency between 40 kHz and 70 kHz toward the conductor.

6. The device of claim 1, wherein the first electrode and the second electrode are supported on a single base, and the first electrode is situated on the base relative to the second electrode including a first spacing between the first electrode and the second electrode that is larger than a second spacing between the second electrode and an expected position of at least a portion of the conductor.

7. The device of claim 1, wherein
the electrically conductive wire handling machine component comprises at least one blade; and
there is no electrically conductive contact between the blade and any of the first electrode, the second electrode and the processor.

8. The device of claim 1, wherein
the wire handling machine component comprises a cutting blade and at least one stripping blade;
the first characteristic indicates desired contact between the cutting blade and the conductor; and
the second characteristic indicates undesired contact between the at least one stripping blade and the conductor.

9. The device of claim 1, wherein
the first characteristic comprises a first duration; and
the second characteristic comprises a second, different duration.

10. A method of monitoring a conductor, comprising the steps of:
using a first generally flat plate electrode for inducing a signal in a conductor without making electrically conductive, physical contact with the conductor;
using a second generally flat plate electrode for detecting at least some of the induced signal without making electrically conductive, physical contact with the conductor; and
providing an output indication from a processor that receives a signal indication from the second generally flat plate that an electrically conductive wire handling machine component contacts the conductor, wherein the processor output indication has a first characteristic when there is a desired contact between the wire handling machine component and the conductor and the indication has a second, different characteristic when there is an undesired contact between the wire handling machine component and the conductor, wherein the undesired contact is subsequent to the desired contact and the second characteristic of the indication is subsequent to the first indication.

11. The method of claim 10, comprising providing an indication of a defect in the conductor based on the indication having the second characteristic.

12. The method of claim 10, wherein the provided indication indicates when the detected induced signal decreases or is grounded.

13. The method of claim 10, wherein the inducing comprises radiating an electromagnetic field having a frequency between 40 kHz and 70 kHz toward the conductor.

14. The method of claim 10, comprising providing an output that is indicative of a quality of a conductor that has been cut and had insulation removed from near an end of the conductor, wherein the first characteristic is indicative of the desired contact when conductor is cut and the second characteristic is indicative of the undesired contact while the insulation is removed.

15. The method of claim 10, comprising
performing the method without making any electrically conductive connection between the wire handling machine component and any of the first electrode, the second electrode and the processor.

16. The method of claim 10, wherein
the wire handling machine component comprises a cutting blade and at least one stripping blade;
the first characteristic indicates desired contact between the cutting blade and the conductor; and
the second characteristic indicates undesired contact between the at least one stripping blade and the conductor.

17. The method of claim 10, wherein
the first characteristic comprises a first duration; and
the second characteristic comprises a second, different duration.

* * * * *